United States Patent [19]

Yamauchi

[11] Patent Number: 4,570,332

[45] Date of Patent: Feb. 18, 1986

[54] METHOD OF FORMING CONTACT TO THIN FILM SEMICONDUCTOR DEVICE

[75] Inventor: Yutaka Yamauchi, Nara, Japan

[73] Assignee: Sharp Kabushiki Kaisha, Osaka, Japan

[21] Appl. No.: 492,675

[22] Filed: May 9, 1983

[30] Foreign Application Priority Data

May 10, 1982 [JP] Japan .................................. 57-78851
May 10, 1982 [JP] Japan .................................. 57-78852

[51] Int. Cl.$^4$ .................. H01L 21/28; H01L 21/326; H01L 31/18
[52] U.S. Cl. ........................................ 29/586; 29/572; 29/589; 29/590; 29/591; 136/256; 136/249; 136/258; 357/30; 357/65; 427/43.1; 427/53.1
[58] Field of Search ............... 136/249 MS, 256, 255, 136/258 AM; 357/15, 30, 65; 29/572, 584, 586, 589-591; 427/43.1, 53.1

[56] References Cited

U.S. PATENT DOCUMENTS

| | | | |
|---|---|---|---|
| 3,902,920 | 9/1975 | Jordan et al. | 136/258 PC |
| 4,042,418 | 8/1977 | Biter | 136/249 MS |
| 4,166,918 | 9/1979 | Nostrand et al. | 136/243 |
| 4,428,110 | 1/1984 | Kim | 29/572 |
| 4,443,651 | 4/1984 | Swartz | 136/249 MS |

Primary Examiner—Aaron Weisstuch
Attorney, Agent, or Firm—Birch, Stewart, Kolasch & Birch

[57] ABSTRACT

A method for making an electrode on a desired region of a thin film semiconductor layer having a junction therein and deposited on a conductive surface comprising the steps of applying an electrical pulse signal across the semiconductor layer at the desired region to lower the resistivity of the region and then forming an electrode film on the desired region of said semiconductor layer opposite said conductive surface, is disclosed. In one alternative embodiment, an electrode film is formed on the thin film semiconductor layer and thereafter an electrical pulse signal is applied across the semiconductor layer at the desired region to lower the resistivity of the region.

23 Claims, 16 Drawing Figures

METHOD OF FORMING CONTACT TO THIN FILM SEMICONDUCTOR DEVICE

BACKGROUND OF THE INVENTION

This invention relates to a thin film solar cell or a thin film semiconductor device.

Recently, the development of thin film semiconductor devices employing amorphous, microcrystalline, or polycrystalline semiconductors as well as amorphous silicon (hereinafter denoted by a-Si) has been vigorously carried out to overcome the deficiencies of semiconductor devices using conventional single crystals. It has been known that the non-crystalline, microcrystalline and polycrystalline semiconductor devices have properties such that the distribution of current in a horizontal direction of a film is low since the resistivity of the film is high and that the resistivity is reduced if the film is crystallized by using electromagnetic or thermal means.

An example of an a-Si solar cell will be first described as a thin film semiconductor device which has been conventionally employed.

FIG. 1 shows a cross-sectional view of a conventional p-i-n junction-type amorphous solar cell 2 formed on a stainless steel (conductive) substrate 1. FIG. 1(a) is a case wherein an electrical terminal 5 is provided on a lower portion of the conductive substrate 1 opposite an electrode 4 of a cell area covered with a transparent conductive film 3. FIG. 1(b) illustrates a structure wherein another electrode 6 is formed on an upper surface (cell area) of the substrate 1 by removing a part of the semiconductor thin film (amorphous silicon junction layer) on the substrate 1 by physical or chemical means. The structure shown in FIG. 1(a) has a disadvantage because locations for providing the semiconductor device and associated wiring are remarkably limited. The structure shown in FIG. 1(b) has a disadvantage because the a-Si layer is etched away or the deposited region of an a-Si layer must be previously restricted, thus complicating the manufacturing process or greatly reducing the cell area.

OBJECT AND SUMMARY OF THE INVENTION

An object of the present invention is to provide a thin film semiconductor device wherein the disadvantages of conventional devices are eliminated.

Another object of the present invention is to provide an amorphous, microcrystalline, or polycrystalline semiconductor device having a novel electrical terminal by utilizing described properties.

A further object of the present invention is to provide a thin film semiconductor device wherein both electrodes are easily provided on the same surface of a semiconductor layer by lowering the resistivity of a thin film semiconductor layer to form a terminal for the electrode.

Still another object of the present invention is to provide a thin film semiconductor device which can be easily connected to another device.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

According to one embodiment of the present invention, the thin film semiconductor device comprises a thin film semiconductor layer with a junction therein deposited on a conductive substrate, a low resistivity region formed on a part of the thin film semiconductor layer by destroying the junction thereof, a first electrode film formed on the thin film semiconductor layer, and a second electrode separated from the electrode film and formed on the low resistivity region.

According to another embodiment of the present invention, a method of making an electrode on a thin film semiconductor layer having a junction such as p-i-n, p-n and the like produced on a conductive substrate comprises: applying a sufficient amount of energy to destroy the junction at a region of the thin film semiconductor layer formed on the conductive substrate, thereby lowering the resistivity of this region; and depositing an electrode film on the low resistivity region.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figures 1A, 1B:
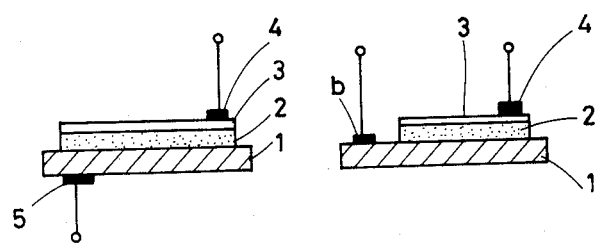
FIGS. 1(a) and (b) are cross-sectional views of conventional light-responsive semiconductor devices.
Figure 2:
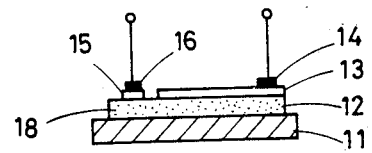
FIG. 2 is a cross-sectional view of a semiconductor device according to one embodiment of the present invention.

FIG. 2 is a side view showing one embodiment of a thin film semiconductor device according to the present invention, wherein an a-Si layer 12 adapted for a solar cell is deposited on a stainless steel substrate or other conductive substrate 11 formed by depositing a conductive layer on an insulating substrate. The a-Si layer 12 is provided with a junction such as a p-n junction, p-i-n junction, M-I-S barrier, Schottky barrier, or the like, and includes a single layer with the junction, or a plurality of layers with the junctions to generate photovoltaic power by receiving incident light. Two electrodes 14 and 16 for obtaining an output and respective transparent electrode films 13 and 15 are provided on one surface of a-Si layer 12. The transparent electrode film 13 covers the greater part of the cell area. On the contrary, the transparent electrode film 15 acts as an electrode for obtaining an output from the opposite surface of a-Si layer 12, and is spaced apart from the transparent electrode film 13. Terminals 14 and 16 of silver paste are provided on the transparent electrode films 13 and 15, respectively.

To make electrical contact with the opposite surface of a-Si layer 12, a sufficient amount of energy for destroying the junction is applied to a region 18 of the thin film semiconductor layer sandwiched between the transparent electrode film 15 and the substrate 11, thereby lowering the resistivity of the region 18. The electrode terminal 16 is provided on the low resistivity region through the transparent electrode film 15.

Figure 4:
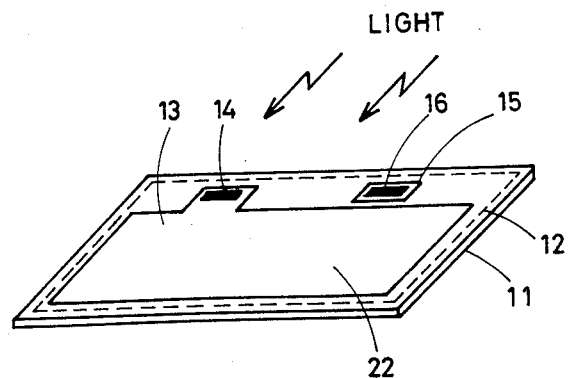
FIG. 4 is a perspective view of the semiconductor device according to an embodiment of the present invention.
Figure 3:
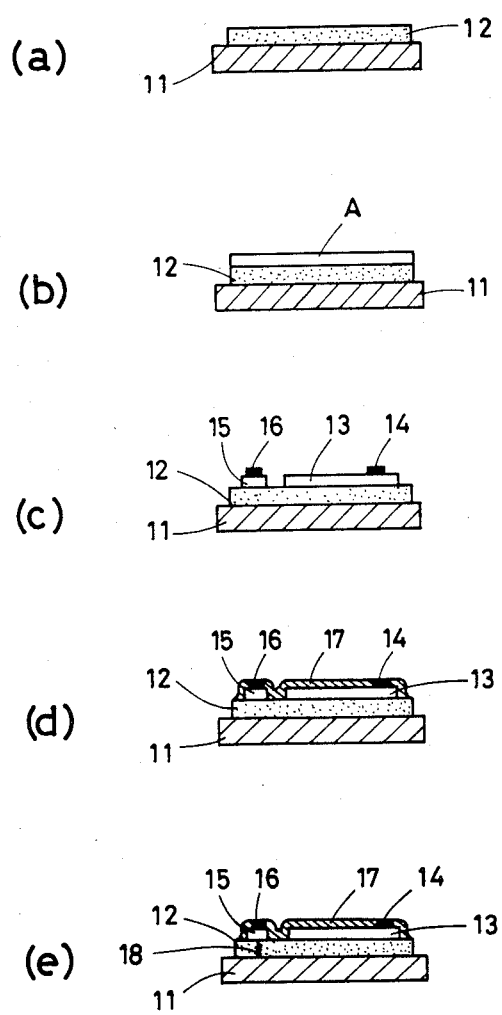
FIGS. 3(a) to (e) are cross-sectional views for explaining the manufacturing process of an embodiment according to the present invention.

Next, the embodiment will be described in detail with respect to the manufacturing processes of the thin film semiconductor device as shown in FIG. 2. FIGS. 3($a$) to ($e$) are cross-sectional views of successive steps in the process. After cleaning the conductive substrate 11 made of a metal or metal alloy such as stainless steel, iron, copper, silver, aluminum, aluminum alloys, nickel, iron-nickel alloys, etc., the amorphous semiconductor layer 12 is deposited on one surface of the substrate by using plasma CVD techinques as shown in FIG. 3($a$). To render the photoelectric conversion characteristic to the amorphous semiconductor layer 12, a single cell with a p-i-n junction, or a tandem cell with plural p-i-n junctions is provided. In the case of an a-Si layer, p-type, i-type, and n-type layers are successively deposited on the substrate by means of the plasma CVD technique, using a feed gas of $SiH_4$ containing a small amount of $B_2H_6$, $SiH_4$ or $SiH_4$ and $SiF_4$, and $SiH_4$ gas or $SiH_4$ and $SiF_4$ containing a small amount of $PH_3$, respectively. The film thickness of each layer is designed to produce the maximum photovoltaic effect. The following shows one example. In the case of the single cell with a p-i-n junction, p$\sim$500 Å, i$\sim$5000 Å, and n$\sim$150 Å. In the case of a tandem cell with p-i-n junctions, $p_1 \sim 700$ Å, $i_1 \sim 3500$ Å, $n_1 \sim 150$ Å, $p_2 \sim 150$ Å, $i_2 \sim 600$ Å and $n_2 \sim 150$ Å. Thereafter, a transparent conductive film A is deposited on the entire surface of the amorphous semiconductor layer 12. The transparent conductive film A is provided by depositing ITO ($In_2O_3$—$SnO_2$) or $SnO_2$:Sb to a thickness of about 600 Å to about 1000 Å on the surface by means of electron beam deposition techniques or sputtering techniques. The transparent conductive film A is then patterned by means of chemical techniques as shown in FIG. 3($c$) so as to divide it into the transparent electrodes 13 and 15. Further, a silver paste is screen printed on a part of the transparent electrodes 13 and 15 to provide electrode terminals 14 and 16 thereon, respectively. The surface of the semiconductor layer is coated with a transparent resin 17 except for the upper surfaces of the electrode terminals 14 and 16 as shown in FIG. 3($d$). Finally, the amorphous semiconductor junction layer of the p-i-n junction is locally destroyed by applying electromagnetic energy between the conductive substrate 11 and the electrode 16, thereby forming a low resistivity region 18 therein. The resistance value Rs of the low resistivity region 18 is less than several tens of ohms, and the characteristics of the amorphous solar cell are not decreased by the series resistance Rs when the amorphous semiconductor solar cell is operated at low illumination (100 to 5000 lux). FIG. 4 is a perspective view of an amorphous solar cell suitable for consumer items produced by the process described above.

The energy for producing the low resistivity region by locally destroying the junction of the thin film semiconductor layer can be provided by electromagnetic and thermal energy in the form of electrical pulses, optical lasers, electron beams, and the like.

In the process for making the thin film semiconductor device, a method of locally destroying the junction by using electrical pulses for the purpose of lowering the resistivity of the semiconductor region 18 sandwiched between the electrode terminal 16 and the conductive substrate 11 will now be explained.

Figure 5:
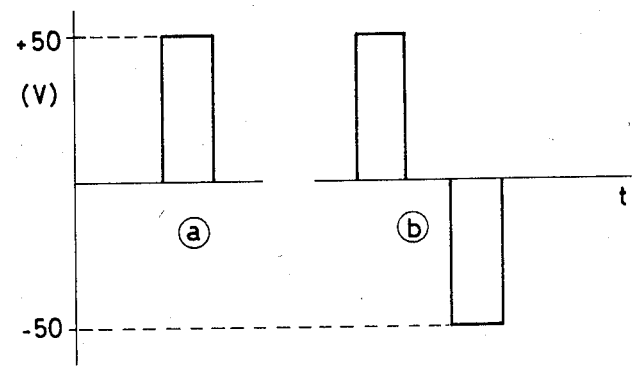
FIG. 5 depicts pulse waveforms supplied to a thin film semiconductor layer so as to provide a low resistivity region according to the present invention.
Figure 6:
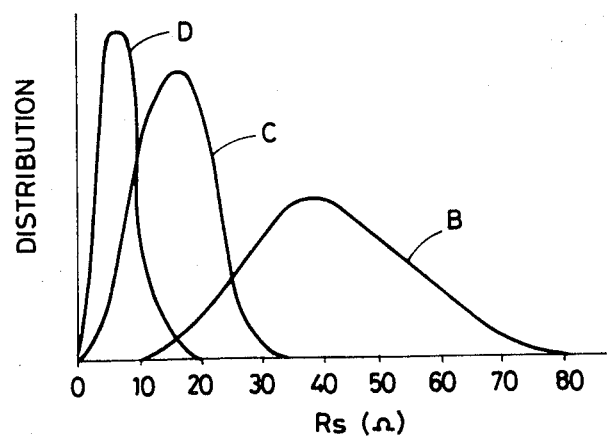
FIG. 6 is a graph showing the relation between the number of applied pulses and a resistance distribution.

A tandem-type amorphous solar cell comprises the stainless steel / $p_1$-$i_1$-$n_1$/$p_2$-$i_2$-$n_2$/ITO structure, and the film thickness of each layer is given by $p_1 \sim 700$ Å, $i_1 \sim 4000$ Å, $n_1 \sim 150$ Å, $p_2 \sim 150$ Å, $i_2 \sim 600$ Å, $n_2 \sim 150$ Å, and ITO $\sim 700$ Å, respectively. In this case, a reverse bias pulse voltage is applied between the substrate and the ITO electrode 16 on the $n_2$ side so that the substrate is grounded and the ITO electrode receives the positive voltage. When a pulse having a voltage of +50 V and a pulse width of 4 n sec, as shown by ⓐ of FIG. 5, is applied once to the semiconductor region 18, the series resistance Rs shows a distribution given by curve B of FIG. 6. When a pair of negative and positive pulses as shown by ⓑ of FIG. 5 is applied to the semiconductor region 18, the resistance value distribution is decreased as shown by a curve C of FIG. 6. Further, when the pulses of ⓑ in FIG. 5 are applied twice to the semiconductor region, the resistance value distribution shifts to lower values as shown by curve D of FIG. 6, and is below 20 Ω. The resistance value cannot be reduced to zero, but can be lowered to 1 to 100 Ω by electromagnetic means.

Figure 7:
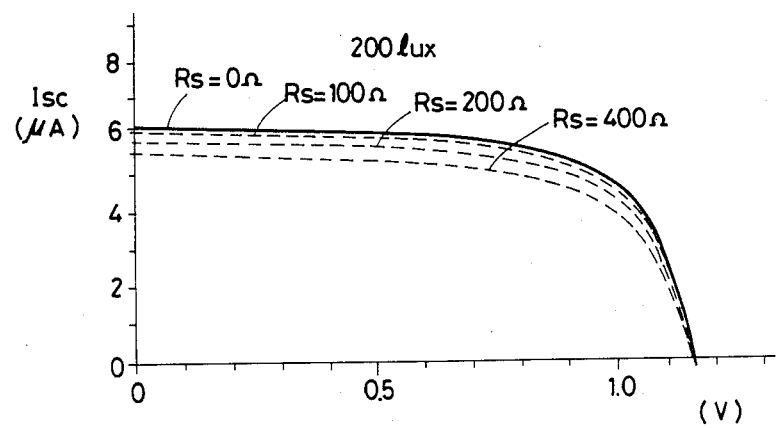
FIGS. 7 and 8 are graphs showing characteristics depending upon the series resistance of an amorphous semiconductor solar cell.
Figure 8:
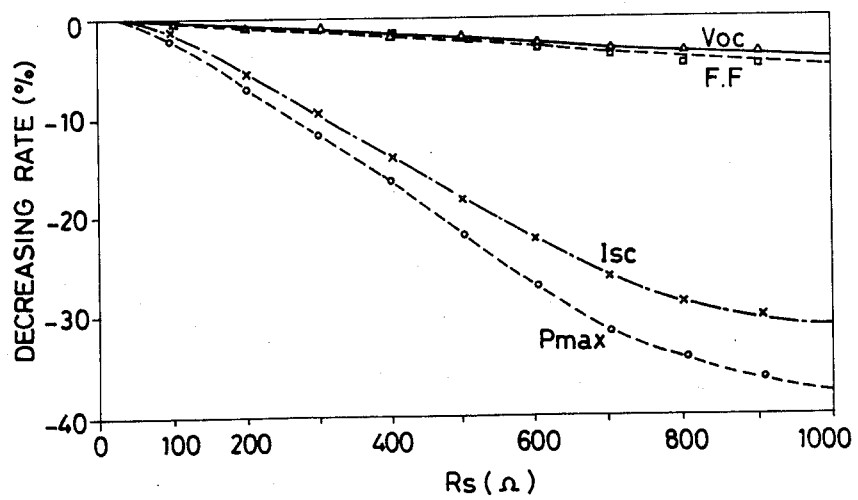

The following shows the experimental results of measurements of the characteristics of the solar cell as a function of the resistance value in the region 18. FIG. 7 illustrates the influence of the series resistance in the case where an amorphous silicon solar cell of cell area of 1 cm$^2$ is operated under a fluorescent lamp with an illumination of 200 lux. Further, FIG. 8 shows the relation between the series resistance and the decreasing rate of the electrical characteristics. As will be apparent from FIGS. 7 and 8, it is found that the decreasing rate of the characteristics is about 2% when the series resistance value is 100 Ω, and that the characteristics are practically unaffected by a decreasing rate of the order of 2%. Accordingly, since the resistance value of below 20 Ω which is obtained by the application of energy pulses is less than 100 Ω as shown in FIGS. 7 and 8, it will be evident that the characteristics of the amorphous solar cell are not deteriorated.

It is possible to employ optical laser devices (Ar laser, YAG laser, and $CO_2$ laser) for locally destroying the semiconductor junction layer.

Further, it is also possible to destroy the junction by arranging the tandem-type amorphous solar cell in a vacuum chamber and applying an electron beam (for example, 20 KV, $10^{-6}$A) to the semiconductor region to be destroyed. In this case, the amorphous silicon hydrogen alloy (a-Si:H) solar cell composed mainly of monosilane ($SiH_4$) feed gas is destroyed by lower energy than that of a fluorinated amorphous silicon (a-Si:F:H) solar cell made from a $SiF_4$ containing feed gas.

Figure 9:
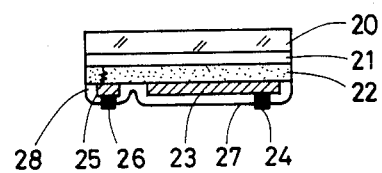
FIGS. 9 and 10 are cross-sectional and perspective views showing another embodiment of the present invention.
Figure 10:
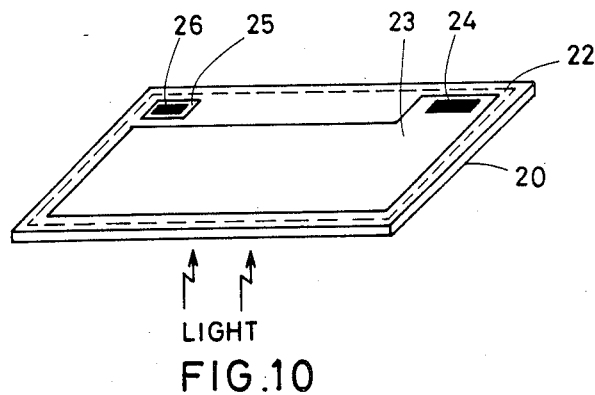
Figure 11:
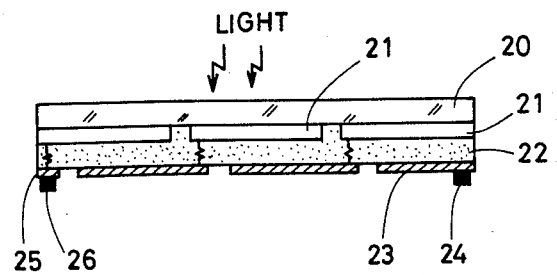
FIG. 11 is a cross-sectional view showing a further embodiment of the present invention.

In the described embodiment, a metal plate conductor is used as the substrate. However, the substrate can be a transparent insulating plate such as glass. That is, a transparent conductive film 21 is formed on one surface of a glass plate 20 as shown in FIG. 9, and an amorphous semiconductor junction layer (p-i-n / p-i-n structure) 22 is deposited on the transparent conductive film by usual procedures. A metal layer (A1) is vacuum deposited on the semiconductor layer 22, and is patterned by chemical techniques in the same manner as the transparent electrodes 13 and 15 of the previously described embodiment, thereby providing backside electrodes 23 and 25 thereon. Thereafter, electrical terminals 24 and 26 are formed on a part of backside electrodes 23 and 25 by printing of Ag paste, and the peripheral portions of the backside electrodes are covered with an epoxy resin system 27. Finally, a low resistivity region 28 is formed by electromagnetic means in the same manner as the previously described embodiment to complete a solar cell. FIG. 10 shows a perspective view of the completed semiconductor device. The described embodiments show a single cell, but it is possible to provide an amorphous solar cell device which includes a plurality of cells, these being electrically connected in series with one another, on the same substrate 20 as shown in FIG. 11.

According to an alternate embodiment of the present invention, electrodes can be easily produced on the same surface of the semiconductor layer by locally lowering the resistivity of the thin film semiconductor layer and then forming electrode terminals on the low resistivity region. In addition, the assembly process of semiconductor devices will be facilitated by automation to remarkably reduce the manufacturing cost, thereby improving the economics and also greatly relieving the restriction for space in which to assemble them.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A method for making an electrode on a desired region of a thin film semiconductor layer having a junction therein and deposited on a conductive surface, comprising the steps of:
    applying an electrical pulse signal across said semiconductor layer at said desired region to lower the resistivity of said region; and
    forming an electrode film on said desired region of said semiconductor layer opposite said conductive surface.

2. The method as recited in claim 1, wherein the electrical pulse signal includes a pulse of a single polarity.

3. The method as recited in claim 2, wherein the pulse has a voltage of 50 volts and a pulse width of 4 n sec.

4. The method as recited in claim 1, wherein the electrical pulse signal includes pulses of positive and negative polarities.

5. The method as recited in claim 1, wherein said thin film semiconductor layer includes a single layer with a junction selected from the group consisting of a p-n junction, p-i-n junction, M-I-S junction, and a Schottky barrier.

6. The method as recited in claim 1, wherein said thin film semiconductor layer includes a plurality of layers with a junction selected from the group consisting on a p-n junction, a p-i-n junction, a M-I-S junction, and a Schottky barrier.

7. The method as recited in claim 1, wherein the thin film semiconductor layer comprises amorphous silicon.

8. The method as recited in claim 1, wherein the conductive surface comprises a substrate formed of a metal selected from the group consisting of stainless steel, iron, copper, silver, aluminum, aluminum alloys, nickel, and iron-nickel alloys.

9. The method as recited in claim 1, wherein the electrode film is selected from the group consisting of a mixture of $In_2O_3$ and $SnO_2$, a mixture of $SnO_2$ and Sb, and aluminum.

10. The method as recited in claim 1, wherein the conductive surface comprises a conductive film formed on a glass plate.

11. The method as recited in claim 1, wherein said step of forming an electrode film on said desired region of said semiconductor layer opposite said conductive surface is performed before said step of applying an electrical pulse signal across said semiconductor layer at a desired region to lower the resistivity of said region.

12. The method as recited in claim 1, wherein said step of forming an electrode film on said desired region of said semiconductor layer opposite said conductive surface is performed after said step of applying an electrical pulse signal across said semiconductor layer at a desired region to lower the resistivity of said region.

13. The method as recited in claim 1, wherein said step of applying an electrical pulse signal across said semiconductor layer at said desired region lowers the resistivity of said region by destroying said junction.

14. The method as recited in claim 1, wherein the region of lowered resistivity has a resistance of about 1 to about 100 ohms.

15. A method for making an electrode on a desired region of a thin film semiconductor layer having a junction therein, comprising the steps of:
    depositing a semiconductor layer on a surface;
    depositing a transparent electrode film on the surface of said semiconductor layer opposite said conductive surface;
    etching said transparent electrode film to divide it into two electrode zones, one of said zones being located over said desired region;
    applying an electrical pulse signal across said desired region of said semiconductor layer to lower the resistivity of said region.

16. The method as recited in claim 15, wherein said thin film semiconductor layer includes a single layer with a junction selected from the group consisting of a p-n junction, p-i-n junction, M-I-S junction, and a Schottky barrier.

17. The method as recited in claim 16, wherein said thin film semiconductor layer includes a plurality of layers with a junction selected from the group consisting of a p-n junction, a p-i-n junction, a M-I-S junction, and a Schottky barrier.

18. The method as recited in claim 15, wherein said transparent electrode film is selected from the group consisting of a mixture of $In_2O_3$ and $SnO_2$, and a mixture of $SnO_2$ and Sb.

19. The method as recited in claim 18, wherein the transparent electrode film has a thickness of about 600 to about 1000 angstroms.

20. The method as recited in claim 15, wherein said step of depositing a transparent electrode film on the surface of said semiconductor layer opposite said conductive surface is performed before said step of applying an electrical pulse signal across said desired region of said semiconductor layer to lower the resistivity of said region.

21. The method as recited in claim 15, wherein said step of depositing a transparent electrode film on the surface of said semiconductor layer opposite said conductive surface is performed after said step of applying an electrical pulse signal across said desired region of said semiconductor layer to lower the resistivity of said region.

22. The method as recited in claim 15, wherein said step of applying an electrical pulse signal across said desired region located under one of said two electrode zones lowers the resistivity of said region by destroying said junction.

23. The method as recited in claim 15, wherein the region of lowered resistivity has a resistance of about 1 to about 100 ohms.

* * * * *